United States Patent
Otake

(10) Patent No.: US 9,673,761 B2
(45) Date of Patent: Jun. 6, 2017

(54) POWER AMPLIFIER AND POWER AMPLIFICATION METHOD

(71) Applicant: NEC Corporation, Minato-ku, Tokyo (JP)

(72) Inventor: Sumitaka Otake, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/031,795

(22) PCT Filed: Nov. 14, 2013

(86) PCT No.: PCT/JP2013/006691
§ 371 (c)(1),
(2) Date: Apr. 25, 2016

(87) PCT Pub. No.: WO2015/071931
PCT Pub. Date: May 21, 2015

(65) Prior Publication Data
US 2016/0248383 A1    Aug. 25, 2016

(51) Int. Cl.
*H03F 3/19* (2006.01)
*H03F 1/02* (2006.01)
(Continued)

(52) U.S. Cl.
CPC ............. *H03F 1/0288* (2013.01); *H03F 3/19* (2013.01); *H03F 3/211* (2013.01); *H03F 3/245* (2013.01);
(Continued)

(58) Field of Classification Search
CPC .................................. H03F 1/0288; H03F 3/19
(Continued)

(56) References Cited

U.S. PATENT DOCUMENTS

2003/0210096 A1* 11/2003 Pengelly ............... H03F 1/0277
330/295
2009/0295473 A1* 12/2009 Dupuy .................. H03F 1/0222
330/124 R
(Continued)

FOREIGN PATENT DOCUMENTS

JP    2010-050986 A    3/2010
JP    2011-188269 A    9/2011
(Continued)

OTHER PUBLICATIONS

International Search Report for PCT Application No. PCT/JP2013/006691, mailed on Jan. 21, 2014.
(Continued)

*Primary Examiner* — Patricia T Nguyen

(57) ABSTRACT

In dividing units, signals propagating between input ports- and output ports and between input ports and output ports have phases shifted by 90° from phases of signals propagating between the input ports and the output port and between the input ports and the output ports. Amplifiers output amplified signals that are in phase to the dividing units. A combining and dividing unit outputs a combined signal obtained by combining signals from the output ports of the dividing units to an input port of a combining unit. A combining and dividing unit outputs a combined signal obtained by combining signals from the output ports of the dividing units to an input port of a combining unit.

12 Claims, 8 Drawing Sheets

(51) Int. Cl.
*H03F 3/24* (2006.01)
*H03F 3/60* (2006.01)
*H03F 3/21* (2006.01)

(52) U.S. Cl.
CPC ....... *H03F 3/602* (2013.01); *H03F 2200/192* (2013.01); *H03F 2200/198* (2013.01); *H03F 2200/204* (2013.01); *H03F 2200/451* (2013.01); *H03F 2203/21142* (2013.01)

(58) Field of Classification Search
USPC ........................................ 330/295, 53, 124 R
See application file for complete search history.

(56) References Cited

U.S. PATENT DOCUMENTS

| | | | | |
|---|---|---|---|---|
| 2011/0279178 A1* | 11/2011 | Outaleb | ................ | H03F 1/0288 330/124 R |
| 2012/0223775 A1* | 9/2012 | Kim | .......................... | H03F 1/56 330/124 R |
| 2013/0154731 A1* | 6/2013 | Gajadharsing | ........ | H03F 1/0294 330/124 R |
| 2014/0375389 A1* | 12/2014 | Jeon | ...................... | H03F 1/0288 330/295 |
| 2015/0091653 A1* | 4/2015 | Kobayashi | ............ | H03F 1/0288 330/295 |

FOREIGN PATENT DOCUMENTS

| | | |
|---|---|---|
| JP | 2012-209757 A | 10/2012 |
| JP | 2013-172174 A | 9/2013 |

OTHER PUBLICATIONS

Junghwan Moon et al., "Highly Efficient Three-Way Saturated Doherty Amplifier With Digital Feedback Predistortion", IEEE, Aug. 2008, IEEE Microwave and Wireless Components Letters, vol. 18, No. 8, pp. 539-541.

* cited by examiner

POWER AMPLIFIER AND POWER AMPLIFICATION METHOD

This application is a National Stage Entry of PCT/JP2013/006691 filed on Nov. 14, 2013, the contents of all of which are incorporated herein by reference, in their entirety.

TECHNICAL FIELD

The present invention relates to a power amplifier and a power amplification method.

BACKGROUND ART

Recently, there has been a demand for communication systems with improved efficiency. For example, linearity and high efficiency are desired for power amplifiers that are used in radio communication systems. Recent communication systems using multi-value digital modulation often use signals each having an average value of a signal amplitude that greatly differs from a maximum value of the signal amplitude. When such signals are amplified by a normal power amplifier, it is necessary to set an operating point of the amplifier so that the signals can be amplified to a maximum amplitude without a distortion. Therefore, as there is almost no time for the power amplifier to operate near a saturated output at which the power amplifier can relatively maintain to be highly efficient, the power amplifier is used with low efficiency.

In order to solve this problem, various techniques for improving the efficiency of the power amplifier while maintaining linearity have been suggested. One of these techniques is Doherty amplifiers. The Doherty amplifiers aim to improve the efficiency of the power amplifiers, combine outputs of carrier amplifiers and peak amplifiers having operation classes different from each other, and output the combined outputs.

When an input signal level is high, the Doherty amplifier amplifies power using both the carrier amplifier and peak amplifier. On the other hand, when the input signal level is low, the peak amplifier does not operate, and the power is amplified by only the carrier amplifier. Then, even when a large back-off is provided to operate the Doherty amplifier, the Doherty amplifier can be operated highly efficiently. A back-off is a difference between average output power and saturated power. Having a large back-off indicates a state in which the average output power is smaller than the saturated power.

A combining circuit that combines the outputs of the carrier amplifier and the peak amplifier includes a transformer and an impedance converter. When the combining circuit processes signals such as microwave bands, the combining circuit often includes a ¼ wavelength transmission line. In order to have a Doherty amplifier achieve an ideal operation, when a characteristic impedance of the transmission line is $Z_0$, an impedance of a load viewed from a combined point of the outputs is usually set to $Z_0/2$. Usually, $Z_0$ is set to 50 Ω in a high frequency circuit.

As described above, an ideal impedance of the load viewed from a Doherty amplifier in general is not the characteristic impedance $Z_0$ of a system but instead $Z_0/2$, which is half of $Z_0$. Accordingly, when a plurality of Doherty amplifiers are operated in parallel, a circuit that transforms an impedance $Z_0$ of a combiner for combining outputs of the plurality of Doherty amplifiers into a load impedance $Z_0/2$ of the Doherty amplifiers is necessary in an output.

An RF power amplifier that amplifies RF signals with improved efficiency over a wide range of power has been suggested as an example of the Doherty amplifier (Patent Literature 1). FIG. 8 is a block diagram showing a configuration of an RF power amplifier 400 which is an example of the Doherty amplifier. The RF power amplifier 400 includes a carrier amplifier 420 and three peak amplifiers 421, 422, and 423. The peak amplifiers 421, 422, and 423 are connected to an output load 428 via 90° transformers 424, 425, and 426, respectively. The 90° transformer 430 connects a four-way splitter 432 to the carrier amplifier 420. By setting DC biases of the respective peak amplifiers 421, 422, and 423 to appropriate values, Doherty functions can be expanded by the plurality of peak amplifiers. An increase by the plurality of peak amplifiers corresponding to 6 dB can be expected in the power range, and peak efficiency can be maintained for the increased power range. The efficiency is reduced to some extent due to a limited loss of an N-way splitter. A four-way amplifier expands an efficient power range to a theoretical value of 18 dB. As mentioned above, such an expansion is extremely important in digital communication systems that use modulation schemes in which a ratio between a peak and average power is as high as 13 dB. A four-way configuration provides an overall power increase of 3 dBm as compared to a conventional two-way Doherty circuit. Accordingly, an amplifier which has 120-watt-peak output can be provided by respective paths (carrier and three peak amplifiers) that each use a 30 watt transistor in the four-way Doherty configuration.

There is a report of another example regarding peak amplifiers of a Doherty amplifier in which a plurality of amplifiers are arranged in parallel (Non-Patent Literature 1).

Patent Literature 1: Japanese Unexamined Patent Application Publication No. 2010-50986

Non-Patent Literature 1: Junghwan Moon et al., "Highly Efficient Three-Way Saturated Doherty Amplifier With Digital Feedback Predistortion", IEEE, August 2008, IEEE MICROWAVE AND WIRELESS COMPONENTS LETTERS, VOL. 18, NO. 8, pp. 539-541

SUMMARY OF INVENTION

Technical Problem

However, the inventor has found the following problem in the above techniques. In the above techniques, a plurality of amplifiers (the peak amplifiers 421, 422, and 423 in FIG. 8) are arranged in parallel, and RF signals output from the plurality of amplifiers are combined by a combining unit (a combining unit 440 in FIG. 8). The combined RF signal is output to an output load 428. At this time, an impedance mismatch may occur in the combining unit 440 or the output load 428 due to a manufacturing error or the like. In this case, the impedance mismatch causes reflected waves to be generated in the RF signals. As outputs of the plurality of amplifiers are high impedances, the reflected waves returned to the plurality of amplifiers are reflected again. That is, the reflected waves reciprocate through transmission lines that are in subsequent stages of the outputs of the plurality of amplifiers, thereby generating standing waves. As a result, an influence of the standing waves increases the impedance mismatch.

The present invention has been made in light of the above circumstances, and an object of the present invention is to reduce reflected waves of fundamental waves generated in one of or both a carrier amplifier and a peak amplifier that are connected in parallel and to match an impedance of a Doherty amplifier with a desired value.

Solution to Problem

An aspect of the present invention is a power amplifier including a Doherty amplifier. The Doherty amplifier includes a carrier amplifier unit and a peak amplifier unit and amplifies an input signal. One of or both the carrier amplifier unit and the peak amplifier unit includes: a plurality of dividing units, in which signals propagating between first input ports and second output ports and between second input ports and first output ports of the respective plurality of dividing units have phases shifted by 90° from phases of signals propagating between the first input ports and the first output ports and between the second input ports and the second output ports of the respective plurality of dividing units; a plurality of amplifiers that receive signals that have been obtained by dividing the input signal, amplify the divided input signals that are in phase, and output the amplified input signals respectively to the first input ports of the plurality of dividing units; a combining unit that outputs a combined signal, in which the combined signal is obtained by combining a signal input to a third input port and a signal input to a fourth input port; a first combining and dividing unit that outputs a first combined signal to the third input port of the combining unit, in which the first combined signal is obtained by combining signals from the first output ports of the respective plurality of dividing units; a second combining and dividing unit that outputs a second combined signal to the fourth input port of the combining unit, in which the second combined signal is obtained by combining signals from the second output ports of the respective plurality of dividing units; and a plurality of transmission lines that connect the plurality of amplifiers respectively to the first and second combining and dividing units by the same line length.

Another aspect of the present invention is a power amplification method including steps of inputting an input signal to a Doherty amplifier, in which the Doherty amplifier includes a carrier amplifier and a peak amplifier; in one of or both the carrier amplifier and the peak amplifier, dividing the input signal and inputting divided input signals respectively to the plurality of amplifiers; combining, by a first combining and dividing unit, signals respectively from the first output ports of the plurality of dividing units, and outputting a first combined signal to a third input port of the combining unit from the first combining and dividing unit; and combining, by a second combining and dividing unit, signals respectively from the second output ports of the plurality of dividing units, and outputting a second combined signal to a fourth input port of the combining unit from the second combining and dividing unit. Signals are input respectively from the plurality of amplifiers via a plurality of transmission lines having the same line length to the first and second combining and dividing units.

Advantageous Effects of Invention

According to the present invention, it is possible to reduce reflected waves of fundamental waves generated in one of or both a carrier amplifier and a peak amplifier that are connected in parallel and to match an impedance of a Doherty amplifier with a desired value.

DESCRIPTION OF EMBODIMENTS

Figure 1:
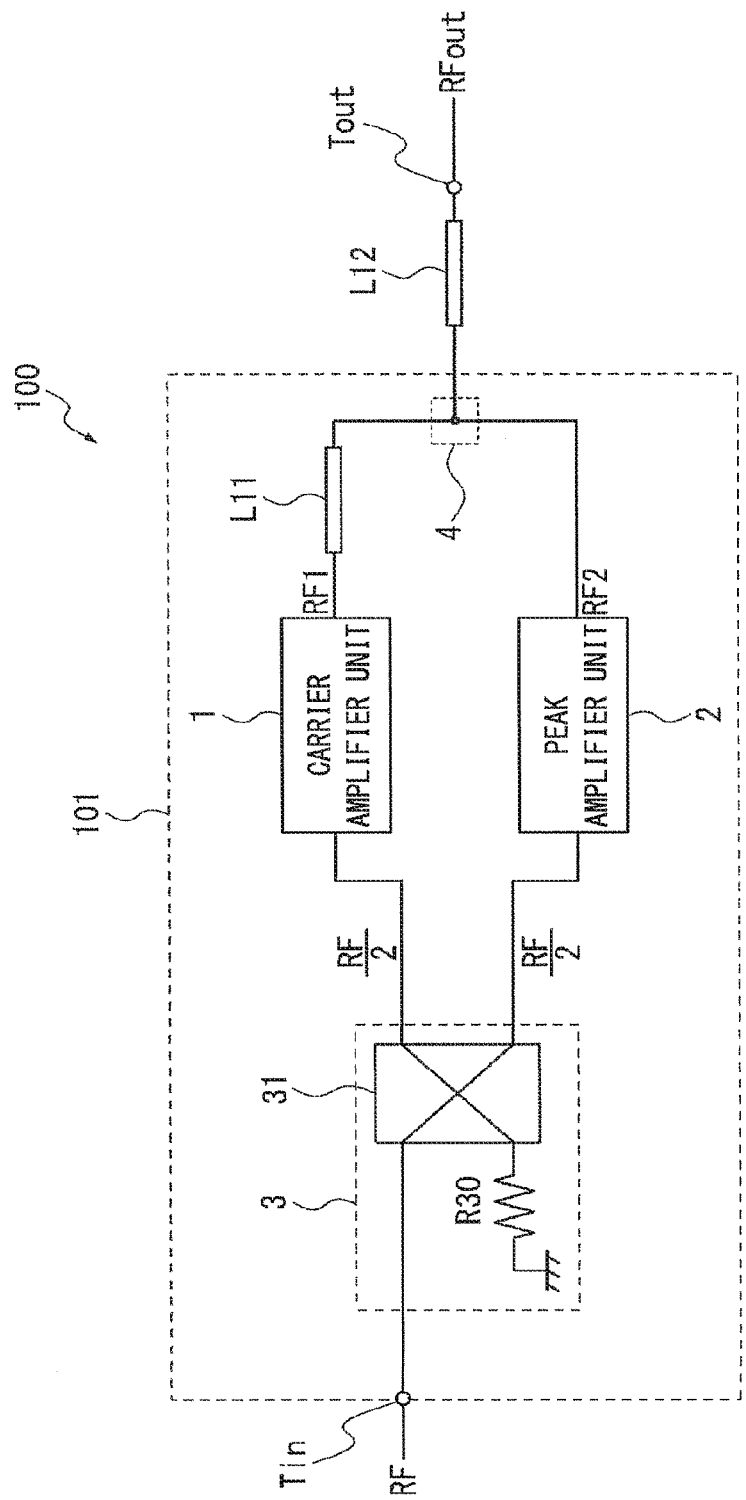
FIG. 1 is a block diagram schematically showing a configuration of a power amplifier 100 according to a first embodiment.

Hereinafter, embodiments of the present invention will be described by referring to the drawings. In the drawings, the same elements are denoted by the same reference signs, and repeated descriptions are omitted as necessary.

First Embodiment

A power amplifier 100 according to a first embodiment will be described below. FIG. 1 is a block diagram schematically showing a configuration of the power amplifier 100 according to the first embodiment. The power amplifier 100 is configured as a power amplifier including a so-called Doherty amplifier. In this embodiment, an example in which the power amplifier 100 includes a Doherty amplifier 101 and a transmission line L12 will be described. The Doherty amplifier 101 is configured to include a carrier amplifier unit 1, a peak amplifier unit 2, a dividing unit 3, a combining unit 4, and a transmission line L11. When high power is requested for the power amplifier 100, both the carrier amplifier unit 1 and the peak amplifier unit 2 are used to amplify power. On the other hand, when the power amplifier 100 operates with low power, the power amplifier 100 stops the peak amplifier unit 2, and only the carrier amplifier unit 1 is used to amplify the power. Thus, the power amplifier 100 can reduce power consumed by power amplification and operate highly efficiently even with an output voltage smaller than saturated power.

The dividing unit 3 divides signals input from an input terminal Tin. The dividing unit 3 includes, for example, a 3 dB 90° hybrid coupler 31. One input port of the 3 dB 90° hybrid coupler 31 is connected to the input terminal Tin. An absorbing resistor R30 is connected between another input port of the 3 dB 90° hybrid coupler 31 and the ground. The input ports of the 3 dB 90° hybrid coupler 31 are isolated from each other. The outputs ports of the 3 dB 90° hybrid coupler 31 are isolated from each other.

An RF signal RF which is a fundamental wave is input to the input terminal Tin. The RF signal RF is a high-frequency signal in the following description. The dividing unit 3 equally divides the RF signal RF and outputs equally divided RF signals (denoted by ½RF in FIG. 1) respectively to the carrier amplifier unit 1 and the peak amplifier unit 2.

As the dividing unit 3 includes the 3 dB hybrid coupler 31, a phase difference of 90° is generated between the equally divided RF signals. In this embodiment, a phase of the RF signal input to the peak amplifier unit 2 is shifted by 90° from a phase of the RF signal input to the carrier amplifier unit 1.

The carrier amplifier unit 1 amplifies the input RF signal (½RF) and outputs an amplified RF signal RF1. The peak amplifier unit 2 amplifies the input RF signal (½RF) and outputs an amplified RF signal RF2. As described above, a phase of the RF signal input to the peak amplifier unit 2 is shifted by 90° from a phase the RF signal input to the carrier amplifier unit 1. Accordingly, a phase of the RF signal RF2 is shifted by 90° from a phase of the RF signal RF1.

The transmission line L11 has a transmission line length of a ¼ wavelength of the RF signal amplified by the carrier amplifier unit 1 and a characteristic impedance of 50 Ω. An output of the carrier amplifier unit 1 is connected to the combining unit 4 via the transmission line L11. An output of the peak amplifier unit 2 is also connected to the combining unit 4. Then, the phase of the RF signal RF1 that has passed through the transmission line L11 and the phase of the RF signal RF2 are synchronized when they are input to the combining unit 4.

The combining unit 4 combines the RF signals RF1 and RF2, the phases of which have been synchronized. The RF signal combined by the combining unit 4 passes through the transmission line L12 and is output from an output terminal Tout as an RF signal RFout. The transmission line L12 has a transmission line length of a ¼ wavelength of the signals amplified by the carrier amplifier unit 1 and the peak amplifier unit 2, and the transmission line L12 converts a load of 50 Ω into 25 Ω. A characteristic impedance of the transmission line L12 is calculated by √(50×25)=35.4 Ω. That is, the transmission line L12 functions as an impedance transformer in the Doherty amplifier.

In general, an ideal impedance of a load viewed from the Doherty amplifier is $Z_0/2$, which is half of a characteristic impedance $Z_0$ of the transmission line L11. In the following description, the characteristic impedance $Z_0$ of the transmission line L11 shall be 50 Ω, and an impedance of a load that is externally connected shall be 25 Ω.

Next, an operation of the Doherty amplifier 101 will be described. The RF signal input from the input terminal Tin is divided to the carrier amplifier unit 1 and the peak amplifier unit 2 by the hybrid coupler 31. The phase of the RF signal divided to the peak amplifier unit 2 is −90° with respect to the signal divided to the carrier amplifier unit 1.

In a region where levels of the RF signals are low, and the peak amplifier unit 2 is turned off, the output of the peak amplifier unit 2 becomes high impedance. Therefore, 25 Ω that is a load when an output side is viewed from the transmission line L11 becomes dominant. The transmission line L11 has a line length of a ¼ wavelength and has a characteristic impedance of 50 Ω. In this case, the load viewed from the carrier amplifier unit 1, which is $Z_{Load}$, can be obtained by the following expression (1), where the characteristic impedance of the transmission line L11 is $Z_0$, and the load on the output side of the transmission line L11 is $Z_{out}$.

[Expression 1]

$$Z_{LOAD} = Z_0 \cdot \frac{Z_0}{Z_{out}} \quad (1)$$

In this example, as $Z_0$ is 50 Ω, and $Z_{out}$ is 25 Ω, $Z_{Load}$ obtained by the expression (1) is 100 Ω. Accordingly, when 25 Ω which is the load when the output side is viewed from the transmission line L11 is transformed, the load viewed from the carrier amplifier unit 1 is 100 Ω. That is, in this case, the carrier amplifier unit 1 operates with a load of 100 Ω, amplifies signals, and outputs the amplified signals.

On the other hand, in a region where levels of the RF signals are high and the peak amplifier unit 2 is turned on, the carrier amplifier unit 1 and the peak amplifier unit 2 each operate with a load of 50 Ω to match 25 Ω which is the load when the output side is viewed from the transmission line L11, and outputs of the carrier amplifier unit 1 and the peak amplifier unit 2 are combined and then output.

As described above, the Doherty amplifier 101 satisfies requirements of a Doherty amplifier for the load of 25 Ω.

When a load of 50 Ω is connected to the output terminal Tout, the transmission line L12 transforms the impedance from 50 Ω into 25 Ω. Therefore, when the output terminal Tout is viewed from the transmission line L11, the load appears to be 25 Ω.

Figure 2:
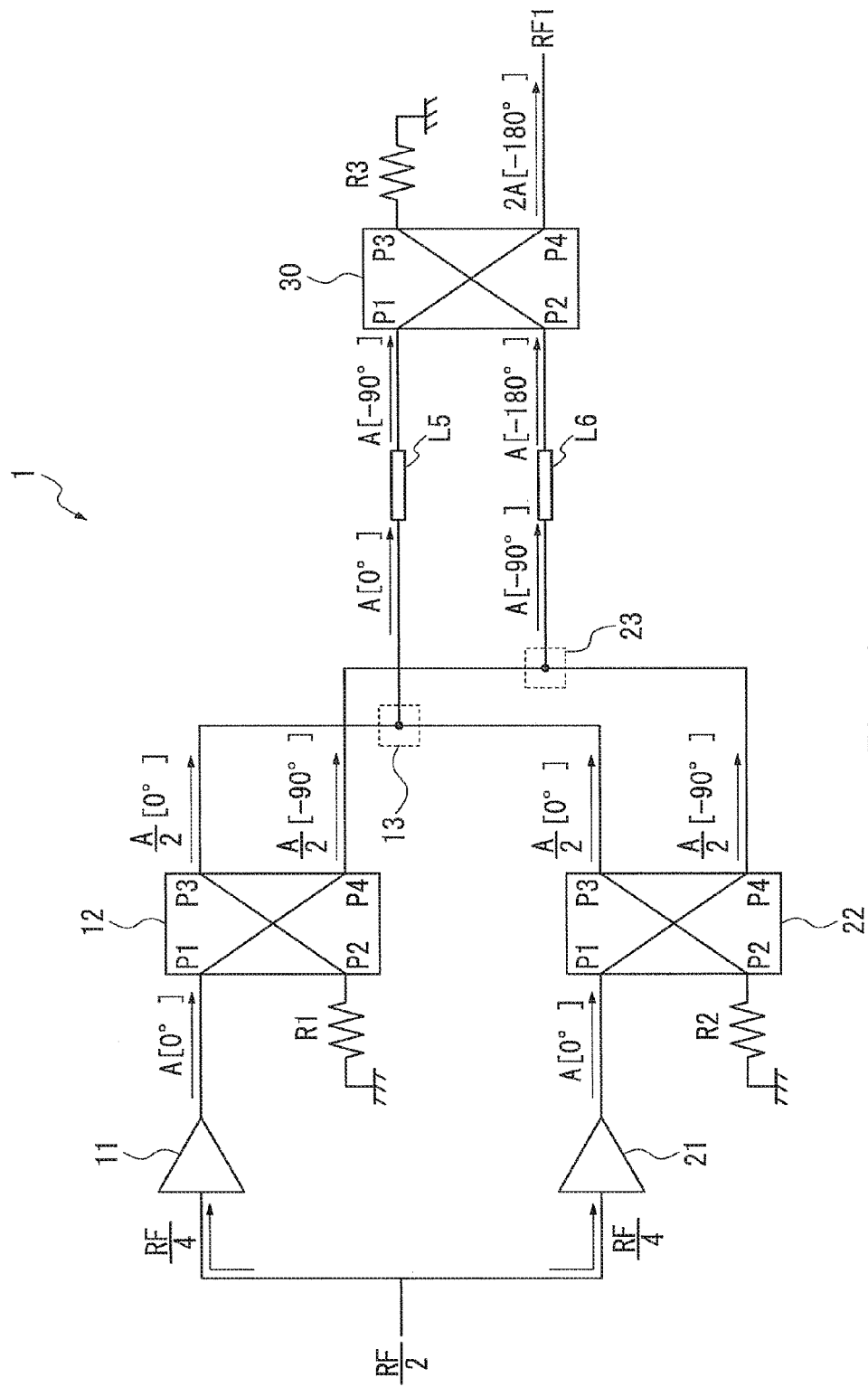
FIG. 2 is a block diagram schematically showing a configuration of a carrier amplifier unit 1 including a plurality of amplifiers.

Next, the carrier amplifier unit 1 and the peak amplifier unit 2 will be described. In this embodiment, one of or both the carrier amplifier unit 1 and the peak amplifier unit 2 have a plurality of amplifiers that are connected in parallel. Hereinafter, an example in which the carrier amplifier unit 1 includes two amplifiers will be described. FIG. 2 is a block diagram schematically showing a configuration of the carrier amplifier unit 1 including a plurality of amplifiers. The carrier amplifier unit 1 includes an amplifier 11, a dividing unit 12, a combining and dividing unit 13, an amplifier 21, a dividing unit 22, a combining and dividing unit 23, a combining unit 30, absorbing resistors R1 to R3, and transmission lines L5 and L6. The transmission lines L5 and L6 have the same line length. The line length of the transmission lines L5 and L6 can be, for example, a ¼ wavelength of the RF signal. The characteristic impedance of both the transmission lines L5 and L6 in this case will be 35.4 Ω.

The RF signal (½RF) input to the carrier amplifier unit 1 is divided (denoted by ¼RF in FIG. 2), and the divided RF signals are input respectively to the amplifiers 11 and 21.

The amplifier 11 amplifies the input RF signal (denoted by ¼RF in FIG. 2) and outputs the amplified RF signal to an input port P1 of the dividing unit 12. The amplifier 21 amplifies the input RF signal (denoted by ¼RF in FIG. 2) by the same gain and in the same phase as those of the amplifier 11. Then, the amplifier 21 outputs the amplified signal to an input port P1 of the dividing unit 22. In FIG. 2, the RF signals amplified by the amplifiers 11 and 21 are represented by A[0°]. Note that A represents power levels of the amplified RF signals, and [0°] represents phases of the amplified RF signals.

The dividing unit 12 is configured as, for example, a 3 dB 90° hybrid coupler. The absorbing resistor R1 is connected between an input port P2 of the dividing unit 12 and the ground. The dividing unit 12 equally divides the RF signal A[0°] that is input to the input port P1 and outputs equally divided RF signals respectively to output ports P3 and P4. In this case, a phase of the RF signal in the output port P4 is shifted by −90° from a phase of the RF signal in the output port P3. In FIG. 2, the RF signal in the output port P3 is denoted by A/2[0°], and the RF signal in the output port P4 is denoted by A/2[−90°]. The RF signal A/2[0°] from the output port P3 of the dividing unit 12 is input to the combining and dividing unit 13. The RF signal A/2[−90°] from the output port P4 of the dividing unit 12 is input to the combining and dividing unit 23. The input ports P1 and P2 of the dividing unit 12 are isolated from each other. The output ports P3 and P4 of the dividing unit 12 are isolated from each other.

The dividing unit 22 is configured as, for example, a 3 dB 90° hybrid coupler. The absorbing resistor R2 is connected between an input port P2 of the dividing unit 22 and the ground. The dividing unit 22 equally divides the RF signal A[0°] that is input to the input port P1 and outputs equally divided RF signals respectively to output ports P3 and P4. In this case, a phase of the RF signal in the output port P4 is shifted by −90° from a phase of the RF signal in the output port P3. In FIG. 2, the RF signal in the output port P3 is denoted by A/2[0°], and the RF signal in the output port P4 is denoted by A/2[−90°]. The RF signal A/2[0°] from the output port P3 of the combining and dividing unit 13 is input to the combining and dividing unit 13. The RF signal A/2[−90°] from the output port P4 of the combining and dividing unit 13 is input to the combining and dividing unit 23. The input ports P1 and P2 of the dividing unit 22 are isolated from each other. The output ports P3 and P4 of the dividing unit 22 are isolated from each other.

Note that the input ports P1 of the dividing units 12 and 22 are also referred to as first input ports. The input ports P2 of the dividing units 12 and 22 are also referred to as second input ports. The output ports P3 of the dividing units 12 and 22 are also referred to as first output ports. The output ports P4 of the dividing units 12 and 22 are also referred to as second output ports.

The combining and dividing unit 13 combines the RF signal A/2[0°] from the output port P3 of the dividing unit 12 with the RF signal A/2[0°] from the output port P3 of the dividing unit 22. The RF signal A/2[0°] from the output port P3 of the dividing unit 12 and the RF signal A/2[0°] from the output port P3 of the dividing unit 22 are combined in phase by the combining and dividing unit 13. The combining and dividing unit 13 outputs a combined RF signal A[0°] to an input port P1 of the combining unit 30 via the transmission line L5. Hereinafter, the combining and dividing unit 13 is also referred to as a first combining and dividing unit. The input port P1 of the combining unit 30 is also referred to as a third input port.

The combining and dividing unit 23 combines the RF signal A/2[−90°] from the output port P4 of the dividing unit 12 and the RF signal A/2[−90°] from the output port P4 of the dividing unit 22. The RF signal A/2[−90°] from the output port P4 of the dividing unit 12 and the RF signal A/2[−90°] from the output port P4 of the dividing unit 22 are combined in phase by the combining and dividing unit 23. The combining and dividing unit 23 outputs a combined signal A sin($\theta_0$−90°) to an input port P2 of the combining unit 30 via a transmission line L6. Hereinafter, the combining and dividing unit 23 is also referred to as a second combining and dividing unit. The input port P2 of the combining unit 30 is also referred to as a fourth input port.

The transmission lines L5 and L6 have a line length of a ¼ wavelength. That is, the phase of the RF signal A[0°] output from the combining and dividing unit 13 is shifted by 90° in the transmission line L5 and becomes the RF signal A[−90°]. Thus, the RF signal A[−90°] is input to the input port P1 of the combining unit 30. The phase of the RF signal A[−90°] output from the combining and dividing unit 23 is shifted by 90° in the transmission line L6 and becomes the RF signal A[−180°]. Then, the RF signal A[−180°] is input to the input port P2 of the combining unit 30. Accordingly, a phase difference between the RF signal input to the input port P1 of the combining unit 30 and the RF signal input to the input port P2 of the combining unit 30 is maintained at 90°.

In order for the loads of the amplifiers 11 and 21 to satisfy $Z_0$=50 Ω, an impedance when the transmission line L5 side is viewed from the combining and dividing unit 13 needs to be $Z_0/2$=25 Ω, and an impedance when the transmission line L6 side is viewed from the combining and dividing unit 23 needs to be $Z_0/2$=25 Ω. When there are manufacturing variations in the transmission lines L5 and L6, the impedance when the transmission line L5 side is viewed from the combining and dividing unit 13 and the impedance when the transmission line L6 side is viewed from the combining and dividing unit 23 deviate from $Z_0/2$=25 Ω, and reflected waves are generated in the RF signal A/2[0°] input to the combining and dividing unit 13 and the RF signal A/2[−90°] input to the combining and dividing unit 23. In this example, the variations in the transmission lines L5 and L6 are considered to be comparable.

The combining unit 30 is configured as, for example, a 3 dB 90° hybrid coupler. The absorbing resistor R3 is connected between an output port P3 of the combining unit 30 and the ground. In the combining unit 30, an output port P4 is connected to the transmission line L11. The input ports P1 and P2 of the combining unit 30 are isolated from each other. The output ports P3 and P4 of the combining unit 30 are isolated from each other.

As the combining unit 30 includes a 3 dB 90° hybrid coupler, when the phase difference of the RF signal input to the input port P2 with respect to the RF signal input to the input port P1 is −90°, the RF signal input to the input port P1 and the RF signal input to the input port P2 are combined, and the combined RF signal is output to the output port P4. In the configuration of FIG. 2, as the RF signal A[−90°] is input to the input port P1 of the combining unit 30, and the RF signal A[−180°] is input to the input port P2 of the combining unit 30, the RF signals are combined, and the RF signal 2A[−180°] is output to the output port P4.

In this way, the RF signal input to the carrier amplifier unit 1 is amplified and output as the RF signal RF1.

Figure 3:
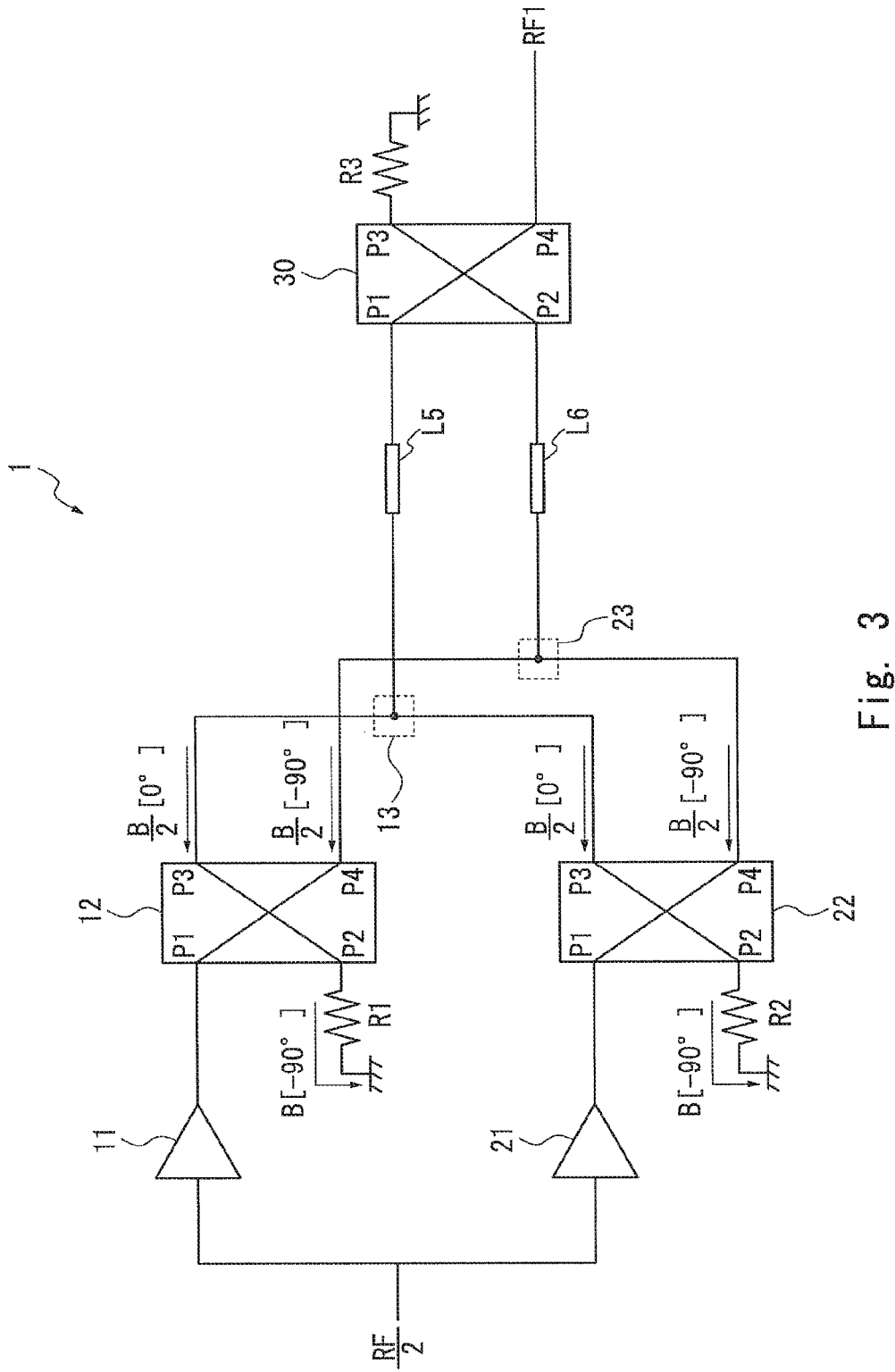
FIG. 3 is a block diagram schematically showing a configuration of the carrier amplifier unit 1 when reflected waves generated in combining and dividing units 13 and 23 are displayed.

Next, an aspect of the reflected waves will be described. Firstly, a case in which the input signal level is high and the peak amplifier unit 2 performs an amplification operation will be described. In this case, the reflected waves are generated in the combining and dividing units 13 and 23. FIG. 3 is a block diagram schematically showing a configuration of the carrier amplifier unit 1 when the reflected waves generated in the combining and dividing units 13 and 23 are displayed. In FIG. 3, the reflected waves for the RF signal A/2[−0°] generated in the combining and dividing unit 13 are represented by a reflected signal B/2[0°]. Further, in FIG. 3, the reflected waves for the RF signal A/2[−90°] generated in the combining and dividing unit 23 are represented by reflected signals B/2[−90°].

The reflected signals B/2[0°] that are reflected by the combining and dividing unit 13 are directed to the output port P3 of the dividing unit 12 and the output port P3 of the dividing unit 22, respectively.

The reflected signals B/2[−90°] that are reflected by the combining and dividing unit 23 are directed to the output port P4 of the dividing unit 12 and the output port P4 of the dividing unit 22, respectively.

The dividing unit 12 includes a 3 dB 90° hybrid coupler. When a phase difference of the reflected signal input to the output port P4 of the dividing unit 12 with respected to the reflected signal input to the output port P3 of the dividing unit 12 is −90°, the reflected signal B/2[0°] input to the output port P3 and the reflected signal B/2[−90°] input to the output port P4 are combined and output from the input port P2, and then absorbed by the absorbing resistor R1. No reflection signal is output from the input port P1. That is, as no reflected wave returns to the amplifier 11, an impedance when the input port P1 of the dividing unit 12 is viewed from the amplifier 11 appears to remain at $Z_0$=50 Ω.

The dividing unit 22 includes a 3 dB 90° hybrid coupler. When a phase difference of the reflected signal input to the output port P4 of the dividing unit 22 with respected to the reflected signal input to the output port P3 of the dividing unit 22 is −90°, the reflected signal B/2[0°] input to the output port P3 and the reflected signal B/2[−90°] input to the output port P4 are combined and output from the input port P2, and then absorbed by the absorbing resistor R2. No reflection signal is output from the input port P1. That is, as no reflected wave returns to the amplifier 21, an impedance when the input port P1 of the dividing unit 22 is viewed from the amplifier 21 appears to remain at $Z_0$=50 Ω.

In order for this configuration to operate as the carrier amplifier unit 1, in addition to it being necessary for this configuration to operate with a load of 50 Ω, the loads of the amplifiers 11 and 21 need to appear to be 100 Ω when the load of the carrier amplifier unit 1 is 100 Ω (when the input signal level is low, and the peak amplifier unit 2 is stopped).

Figure 4:
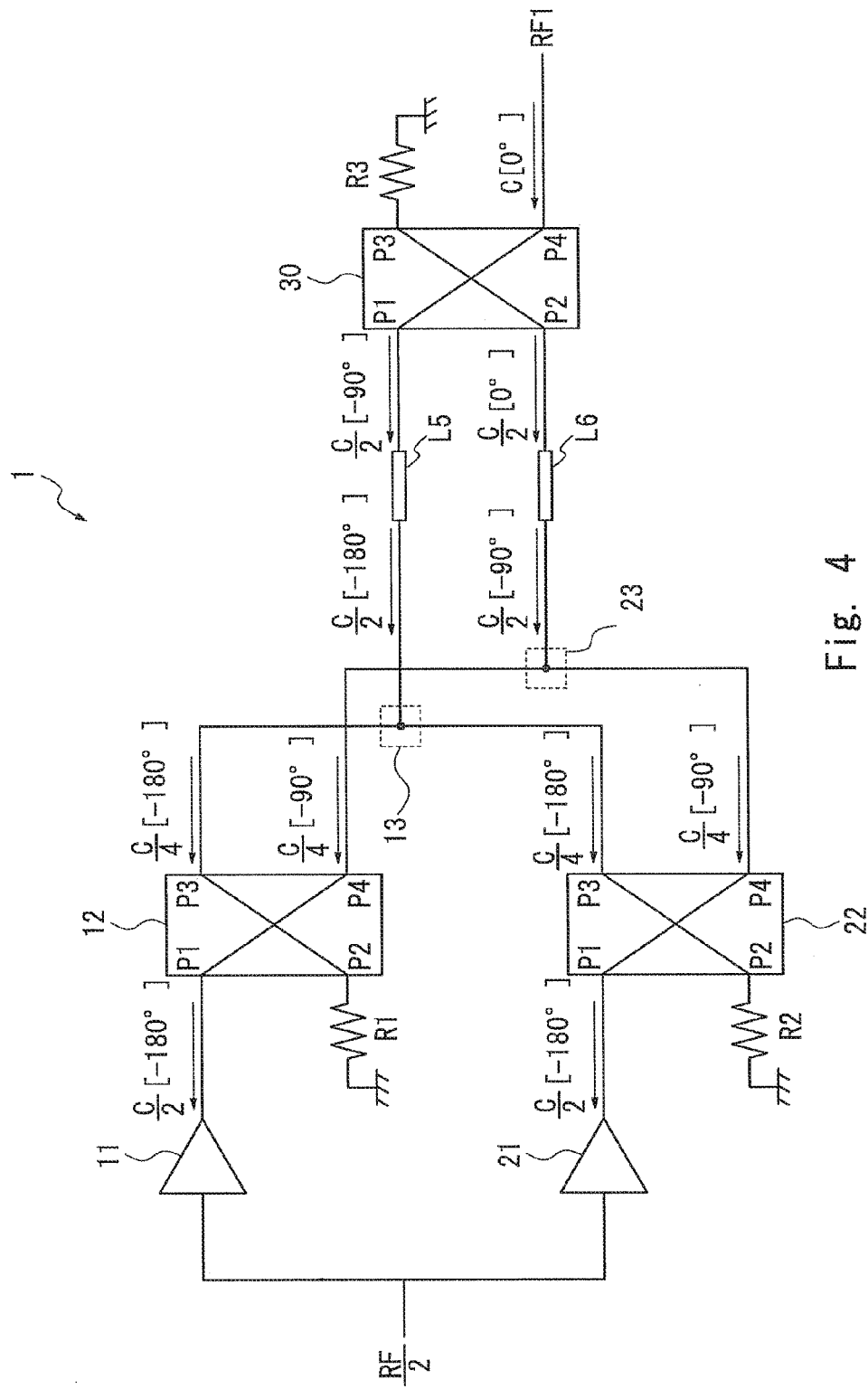
FIG. 4 is a block diagram schematically showing the configuration of the carrier amplifier unit 1 when a reflected wave generated in an output port P4 of a combining unit 30 is displayed.

When the load of the carrier amplifier unit 1 becomes 100 Ω, that is, when the impedance when the output side is viewed from the output port P4 of the combining unit 30 is 100 Ω, the reflected wave is generated in the output port P4 of the combining unit 30. FIG. 4 is a block diagram schematically showing a configuration of the carrier amplifier unit 1 when the reflected wave generated in the output port P4 of the combining unit 30 is displayed. In FIG. 4, the reflected wave for the RF signal 2A[−180°] (see FIG. 2) output from the output port P4 of the combining unit 30 is represented by a reflected signal C[0°].

The reflected signal C[0°] generated in the output port P4 of the combining unit 30 is divided by the combining unit 30 and equally divided between the input ports P1 and P2 of the combining unit 30. A phase difference of −90° is generated in the reflected signal output to the input port P1 of the combining unit 30 with respect to the reflected signal output to the input port P2 of the combining unit 30. In FIG. 4, the reflected signal output to the input port P1 of the combining unit 30 is denoted by C/2[−90°], and the reflected signal output to the input port P2 of the combining unit 30 is denoted by C/2[0°].

As a line length of the transmission line L5 is a ¼ wavelength, the reflected signal output from the input port P1 of the combining unit 30, passes through the transmission line L5, and is input to the combining and dividing unit 13 becomes C/2[−180°].

As a line length of the transmission line L6 is a ¼ wavelength, the reflected signal output from the input port P2 of the combining unit 30, passes through the transmission line L6, and is input to the combining and dividing unit 23 becomes C/2[−90°].

The reflected signal C/2[−180°] input to the combining and dividing unit 13 is equally divided, and the equally divided signals C/4[−180°] are output respectively to the output port P3 of the dividing unit 12 and the output port P3 of the dividing unit 22.

The reflected signal C/2[−90°] input to the combining and dividing unit 23 is equally divided, and equally divided signals C/4[−90°] are output respectively to the output port P4 of the dividing unit 12 and the output port P4 of the dividing unit 22.

As a phase difference of the reflected signal input to the output port P3 of the dividing unit 12 with respect to the reflected signal input to the output port P4 of the dividing unit 12 is −90°, these reflected signals are combined and output from the input port P1 of the dividing unit 12 as C/2[−180°].

As a phase difference of the reflected signal input to the output port P3 of the dividing unit 22 with respect to the reflected signal input to the output port P4 of the dividing unit 22 is −90°, these reflected signals are combined and output from the input port P1 of the dividing unit 22 as C/2[−180°].

The RF signals output from the amplifiers 11 and 21 are A[0°], while the reflected signals returning to the amplifiers 11 and 21 are C/2[−180°]. The RF signal output from the output port P4 of the combining unit 30 is 2A[−180°], while the reflected signal is C[0°]. Thus, a ratio between the RF signal and the reflected signal is 2A:C for both the amplifiers 11 and 21. Further, a ratio between the RF signal and the reflected signal is 180° for both the amplifiers 11 and 21. When the amplifiers 11 and 21 have the same relationship between the RF signal which is a traveling wave and the reflected signal which is a reflected wave, it means that the impedances are the same. Accordingly, loads of the amplifiers 11 and 21 are 100 Ω, which is the same as the load 100 Ω of the carrier amplifier unit 1.

Thus, with this configuration, the loads of the amplifiers 11 and 22 can be matched with a desired impedance both in a state when the peak amplifier unit 2 is operating and in a state when the peak amplifier unit 2 is stopped.

According to this configuration, as described above, it is possible to achieve a power amplifier that can reduce or prevent reflected waves of fundamental waves generated when amplifiers are operated in parallel inside a Doherty amplifier and match loads of the amplifiers to a desired impedance.

Comparative Example 1

Figure 5:
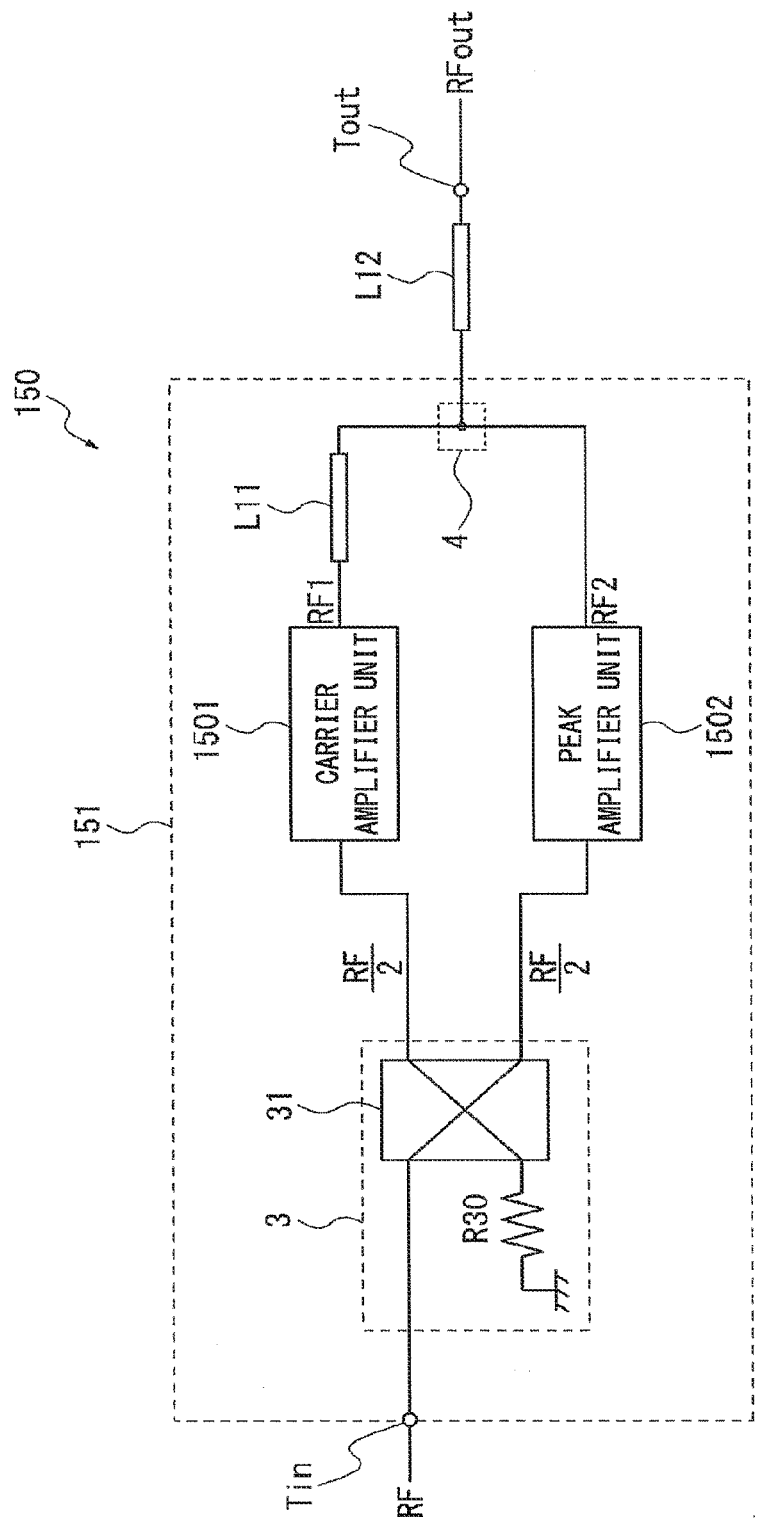
FIG. 5 is a block diagram schematically showing a configuration of a power amplifier 150 according to a comparative example 1.

Next, a power amplifier 150 according to a comparative example 1 will be described in order to help understanding of a function effect of the power amplifier 100 according to the embodiment. FIG. 5 is a block diagram schematically showing a configuration of the power amplifier 150 according to the comparative example 1. The power amplifier 150 is configured as a power amplifier including a so-called Doherty amplifier. In this embodiment, an example in which the power amplifier 150 includes a Doherty amplifier 151 and a transmission line L12 will be described. The Doherty amplifier 151 is configured to include a carrier amplifier unit 1501, a peak amplifier unit 1502, a dividing unit 3, a combining unit 4, and a transmission line L11. When high power is requested for the power amplifier 150, both the carrier amplifier unit 1501 and the peak amplifier unit 1502 are used to amplify power. On the other hand, when the power amplifier 150 operates with low power, the power amplifier 150 stops the peak amplifier unit 1502, and only the carrier amplifier unit 1501 is used to amplify the power.

Thus, the power amplifier 150 can reduce power consumed by power amplification and operate highly efficiently even with an output voltage smaller than saturated power.

As the dividing unit 3 is the same as that in the power amplifier 100, details of the dividing unit 3 will not be described. The dividing unit 3 equally divides the RF signal RF and outputs equally divided RF signals (denoted by ½ RF in FIG. 5) respectively to the carrier amplifier unit 1501 and the peak amplifier unit 1502.

The carrier amplifier unit 1501 amplifies the input RF signal (½RF) and outputs an amplified RF signal RF1. The peak amplifier unit 1502 amplifies the input RF signal (½RF) and outputs an amplified RF signal RF2.

In the power amplifier 150, as a mechanism in which the RF signals RF1 and RF2 are combined by the combining unit 4 and then output from the output terminal Tout via the transmission line L12 is the same as that in the power amplifier 100, a description of such a mechanism will be omitted.

Figure 6:
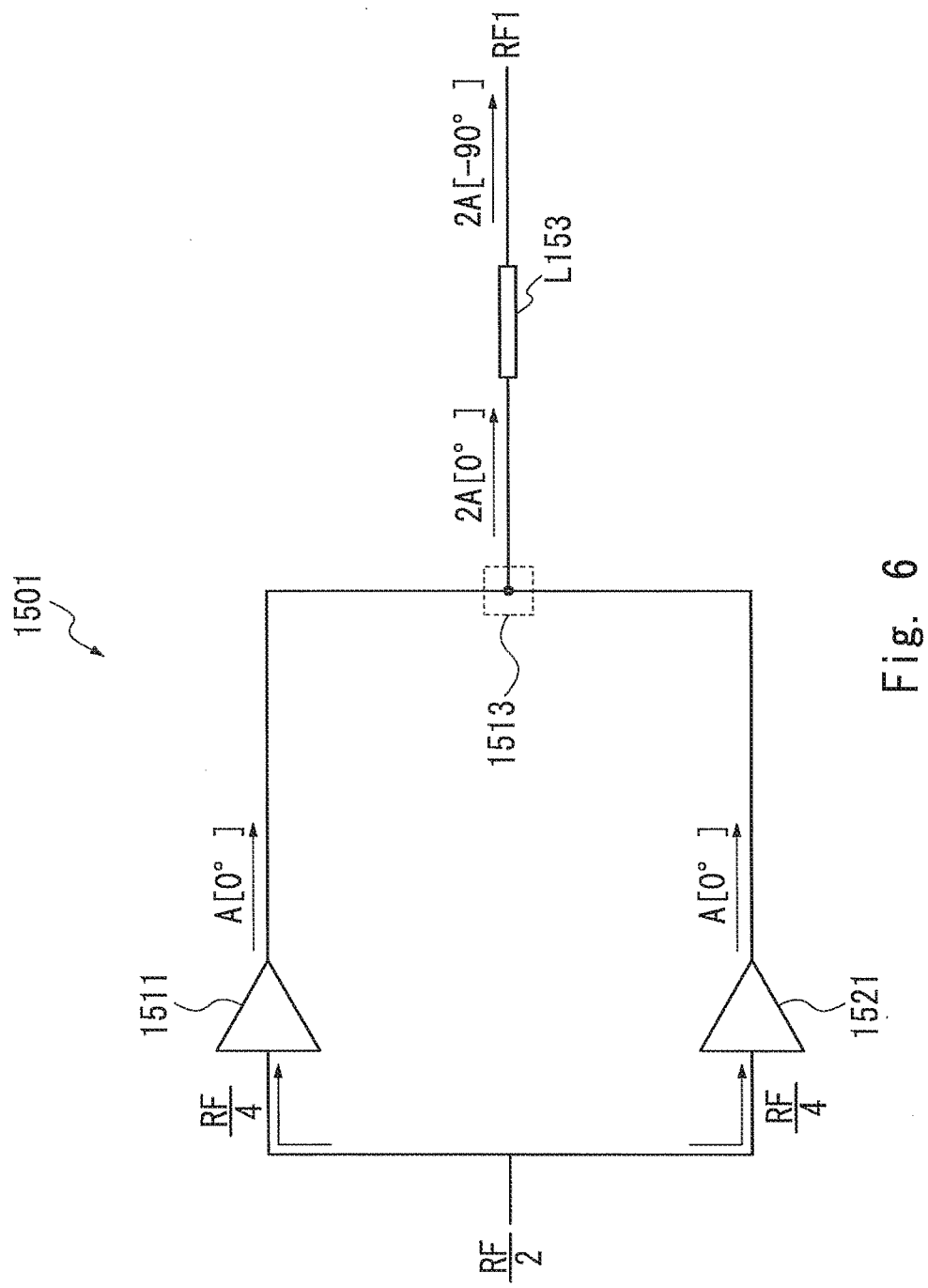
FIG. 6 is a block diagram schematically showing a configuration of a carrier amplifier unit 1501 including a plurality of amplifiers.

Next, the carrier amplifier unit 1501 and the peak amplifier unit 1502 will be described. In this example, one of or both the carrier amplifier unit 1501 and the peak amplifier unit 1502 have a plurality of amplifiers that are connected in parallel. Hereinafter, an example in which the carrier amplifier unit 1501 includes two amplifiers will be described. FIG. 6 is a block diagram schematically showing a configuration of the carrier amplifier unit 1501 including a plurality of amplifiers. The carrier amplifier unit 1501 includes amplifiers 1511 and 1521, a combining and dividing unit 1513, and a transmission line L153. The amplifiers 1511 and 1521 of the carrier amplifier unit 1501 are a class A or biased class AB.

The RF signal (½RF) input to the carrier amplifier unit 1501 is divided (denoted by ¼RF in FIG. 6) and divided RF signals are input respectively to the amplifiers 1511 and 1521.

The amplifier 1511 amplifies the input RF signal (denoted by ¼RF in FIG. 6). The signal amplified by the amplifier 1511 is transmitted to the combining and dividing unit 1513. The amplifier 1521 amplifies the input RF signal (denoted by ¼RF in FIG. 6) by the same gain as that of the amplifier 1511. The signal amplified by the amplifier 1521 is transmitted to the combining and dividing unit 1513.

In FIG. 6, the RF signals amplified by the amplifiers 1511 and 1521 are represented by A[0°]. Note that A represents a power level of the RF signal, and [0°] represents a phase of the RF signal. As phases of the RF signals at output terminals of the amplifiers 1511 and 1521 are used as a reference, they are denoted by 0°.

The RF signal A[0°] from the amplifier 1511 and the RF signal A[0°] from the amplifier 1521 are combined in phase by the combining and dividing unit 1513. The RF signal (denoted by 2A[0°] in FIG. 6) combined by the combining and dividing unit 1513 passes through the transmission line L153, becomes the RF signal RF1, and is output to the transmission line L11 from the carrier amplifier unit 1501.

The transmission line L153 has a transmission line length of a ¼ wavelength of the signal amplified by the carrier amplifier unit 1, and the transmission line L153 converts a load of 50 Ω into 25 Ω. A characteristic impedance of the transmission line L153 is calculated by $\sqrt{(50 \times 25)} = 35.4$ Ω.

Hereinafter, a problem of the power amplifier 150 will be described. The power amplifier 150 is manufactured in such a way that an impedance when the transmission line L153 is viewed from the combining and dividing unit 1513 appears to be 25 Ω. However, there may be variations in the line lengths and line widths due to a manufacturing error or the like. In this case, the characteristic impedance of the transmission line L153 deviates from $\sqrt{(50 \times 25)} = 35.4$ Ω, and the impedance when the transmission line L153 is viewed from the combining and dividing unit 1513 also deviates from 25 Ω. As the loads of the amplifiers 1511 and 1521 appear to be twice as great as the impedance when the transmission line L153 is viewed from the combining and dividing unit 1513, the deviation in the impedance is also twice as great as the original impedance. As a result, the amplifiers 1511 and 1521 cannot be matched with a desired load 50 Ω.

From another point of view, it can be said that a reflected wave is generated in the combining and dividing unit 1513. A part of the reflected wave reaches an output of the amplifier 1511. As the output of the amplifier 1511 is high impedance, the reflected wave that has reached the output of the amplifier 1511 is reflected again. Further, the reflected wave reaches an output of the amplifier 1521. As the output of the amplifier 1521 is high impedance, the reflected wave that has reached the output of the amplifier 1521 is reflected again. As described above, the reflected wave generated in the combining and dividing unit 1513 reciprocates inside the Doherty amplifier 151, thereby generating standing waves.

When the standing waves are generated, the impedances of the transmission lines disposed in the power amplifier 150 deviate, and this causes a problem in an operation of the Doherty amplifier. In the power amplifier 150 including the Doherty amplifier 151, when the carrier amplifier unit 1501 and the peak amplifier unit 1502 perform an amplification operation, the impedance of the transmission line L11 viewed from the carrier amplifier unit 1501 is 50 Ω. On the other hand, when only the carrier amplifier unit 1501 performs an amplification operation, the impedance of the transmission line L11 viewed from the carrier amplifier unit 1501 appears to be 100 Ω. Therefore, when only the carrier amplifier unit 1501 performs an amplification operation, the deviation in the impedances of the transmission lines caused by the standing waves has a particularly large influence.

Further, the amplifiers 1511 and 1512 are manufactured in such a way that their output levels will become the same. However, in practice, there are variations in output levels of the amplifiers 1511 and 1512 due to a manufacturing error or the like. In such a case, some of the RF signals output from one of the amplifiers having a great output level pass through the combining and dividing unit 1513 and reach the other one of the amplifiers, which is a state in which isolation is insufficient. When the amplifiers 1511 and 1512 are biased class C amplifiers, the output levels of the amplifiers 1511 and 1512 are likely to vary, which is particularly problematic. Even in such a case, as the RF signals that have reached the outputs of the amplifiers are reflected, these cause the standing waves to be generated in a manner similar to the reflected waves that cause the standing waves to be generated.

As described above, the power amplifier 150 according to the comparative example 1 cannot reduce the influence of the standing waves generated inside the Doherty amplifier and the loads of the amplifiers cannot be matched with the desired impedance.

On the other hand, in the power amplifier 100 according to the first embodiment, the dividing unit 12 that is at a subsequent stage of the amplifier 11 can absorb RF signals that leak due to the reflected waves and insufficient isolation. Further, the dividing unit 22 that is at a subsequent stage of the amplifier 21 can absorb RF signals that leak due to the reflected waves and insufficient isolation. Consequently, the standing waves will not be generated, thereby preventing deviation of the impedances of the transmission lines. That is, the power amplifier 100 can prevent the standing waves in the Doherty amplifier when a plurality of amplifiers are arranged in parallel in one of or both the carrier amplifier unit 1 and the peak amplifier unit 2.

Second Embodiment

Next, a power amplifier 200 according to a second embodiment will be described. The power amplifier 200 has the same configuration as that of the power amplifier 100 shown in FIG. 1. The power amplifier 200 is configured in such a way that the peak amplifier unit 2 includes a plurality of amplifiers. As the configuration of the power amplifier 200 other than the peak amplifier unit 2 is the same as that of the power amplifier 100, a description of the configuration of the power amplifier 200 other than the peak amplifier unit 2 will be omitted.

Figure 7:
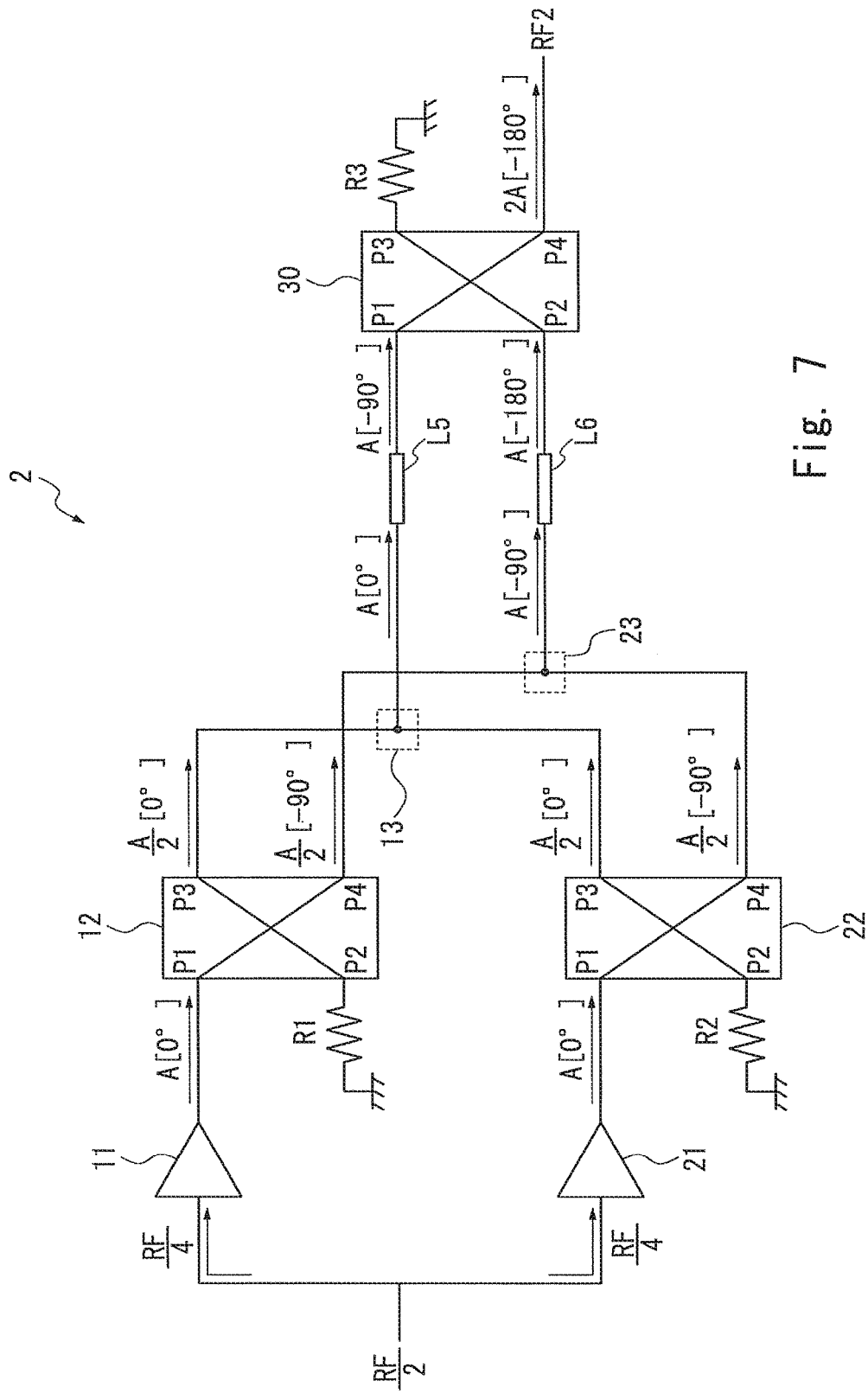
FIG. 7 is a block diagram schematically showing a configuration of a peak amplifier unit 2 of a power amplifier 200 according to a second embodiment.
Figure 8:
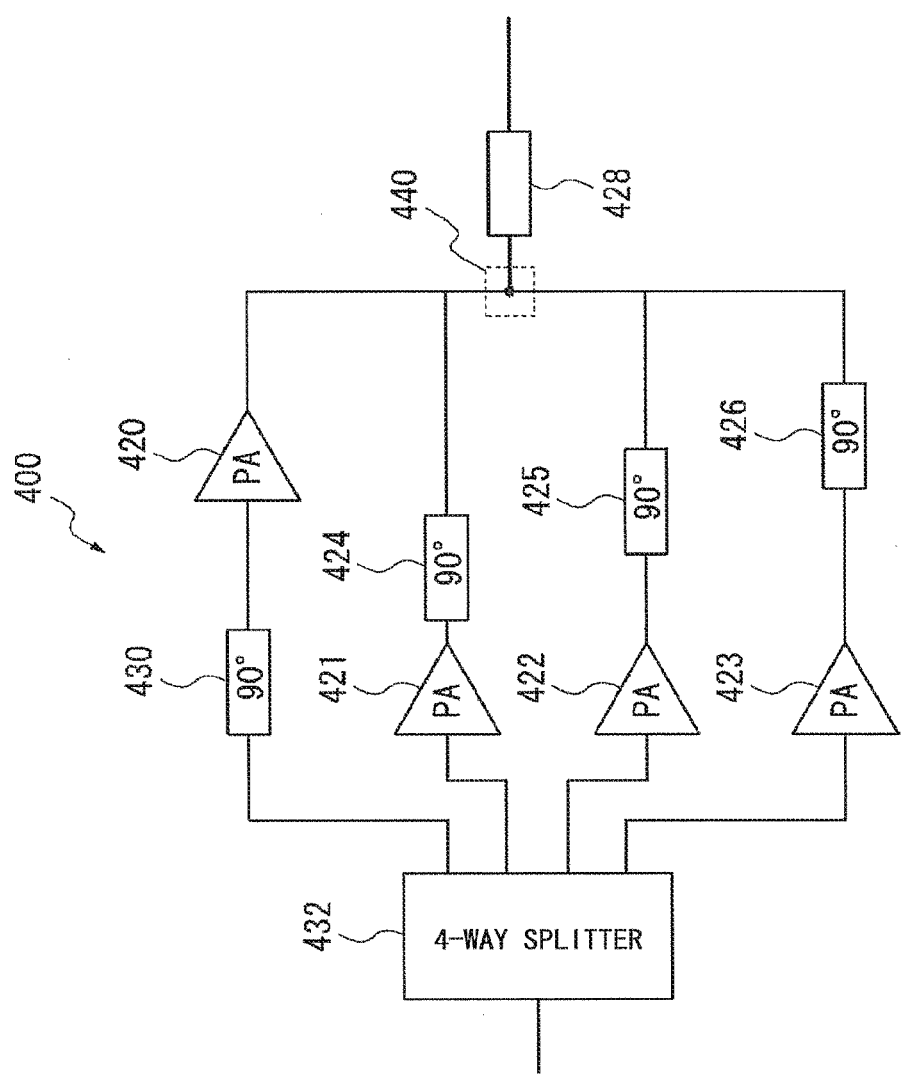
FIG. 8 is a block diagram showing a configuration of an RF power amplifier 400 which is an example of a Doherty amplifier.

FIG. 7 is a block diagram schematically showing a configuration of the peak amplifier unit 2 of the power amplifier 200 according to the second embodiment. As shown in FIG. 7, the peak amplifier unit 2 of the power amplifier 200 can have the same configuration as that of the peak amplifier unit 2 of the power amplifier 100.

According to this configuration, in a manner similar to the first embodiment, it can be understood that a power amplifier capable of reducing or preventing reflected waves of fundamental waves generated when amplifiers are operated in parallel inside a Doherty amplifier and capable of matching loads of the amplifiers with a desired impedance can be achieved.

Other Embodiments

Note that the present invention is not limited to the above embodiments, and modifications can be made without departing from the scope of the invention as appropriate. For example, although in the above embodiments, it has been described that the reflection factors of the RF signals in the input ports P1 and P2 of the combining unit 30 are comparable, it is not limited to this. That is, the reflection factors of the RF signals in the input ports P1 and P2 of the combining unit 30 are not necessarily comparable. Although it has been described that the dividing units 12 and 22 equally divide signals input to the input ports P1 and P2 and the output ports P3 and P4, it is not limited to this. That is, the dividing units 12 and 22 cannot be prevented from dividing the signals input to the input ports P1 and P2 and the output ports P3 and P4 by a ratio other than an equal division. Further, although it has been described that the combining and dividing units 13 and 23 equally divide the reflected waves returned from the combining unit 30, it is not limited to this. That is, the combining and dividing units 13 and 23 cannot be prevented from dividing the reflected signals returned from the combining unit 30 by a ratio other than an equal division. In this case, components that cannot be cancelled remain in the reflected signals in the input ports P1 of the dividing units 12 and 22. However, as the reflected signals can be attenuated, even in this case, the power amplifier according to the above embodiments can exert an effect of reducing the reflected waves.

In the above description, although examples in which the dividing units 12 and 22 and the combining unit 30 are 3 dB 90° hybrid couplers have been described, it is merely illustrative. Other dividers may be incorporated as long as they are dividers having two inputs and two outputs, can divide (or equally divide) signals that are input from the respective inputs into two outputs, and can provide a phase difference of 90° to the divided signals.

Although in the above embodiments, examples in which one of or both the carrier amplifier unit 1 and the peak amplifier unit 2 include two amplifiers and dividers have been described, it is merely illustrative. That is, the carrier amplifier unit and the peak amplifier unit including n (n is an integer greater or equal to three) amplifiers and dividers may be included. In this case, signals each having a phase of [0°] that are output from the n amplifier(s) may be combined by a combining and dividing unit having n input(s) and one output, and then the combined signal may be output to the input port P1 of the combining unit 30. Further, signals each having a phase of [−90°] that are output from the n amplifier(s) may be combined by the combining and dividing unit having n input(s) and one output, and then the combined signal may be output to the input port P2 of the combining unit 30. Thus, in a manner similar to the power amplifier 100, a power amplifier that can reduce reflected waves can be achieved.

In the above embodiments, although impedance conversion by the transmission lines L5 and L6 has been described, it is merely illustrative. For example, it may be configured in such a way that other transmission lines may be provided respectively between the transmission line L5 and the output port P3 of the dividing unit 12, between the transmission line L5 and the output port P3 of the dividing unit 22, between the transmission line L6 and the output port P4 of the dividing unit 12, and between the transmission line L6 and the output port P4 of the dividing unit 22.

Hereinafter, the transmission line provided between the transmission line L5 and the output port P3 of the dividing unit 12 will be referred to as a transmission line L1. The transmission line provided between the transmission line L5 and the output port P3 of the dividing unit 22 will be referred to as a transmission line L3. The transmission line provided between the transmission line L6 and the output port P4 of the dividing unit 12 will be referred to as a transmission line L2. The transmission line provided between the transmission line L6 and the output port P4 of the dividing unit 22 will be referred to as a transmission line L4. Line lengths of the transmission lines L1 to L4 are a ¼ wavelength.

In this example, a configuration in which the transmission line L5 according to the above embodiments is replaced by the transmission line L7, and the transmission line L6 according to the above embodiments is replaced by the transmission line L8 will be examined. A characteristic impedance of the transmission lines L7 and L8 shall be $\sqrt{(50 \times 35)}=42$ Ω. In this case, impedance conversion by the transmission lines L7 and L8 is 35 Ω. Thus, an impedance when the combining and dividing unit 13 is viewed from the transmission lines L1 and L3 is 70 Ω. An impedance when the combining and dividing unit 23 is viewed from the transmission lines L2 and L4 is 70 Ω. Therefore, in order to have an impedance of 50 Ω when the transmission lines L1 and L3 are viewed from the combining unit 12, a characteristic impedance of the transmission lines L1 and L3 should be $\sqrt{(70 \times 50)}=59$ Ω. In order to have an impedance of 50 Ω when the transmission lines L2 and L4 are viewed from the combining unit 13, a characteristic impedance of the transmission lines L2 and L4 should be $\sqrt{(70 \times 50)}=59$ Ω.

In this case, two stages of impedance conversion, which includes impedance conversion by the transmission lines L1 and L3 and the impedance conversion by the transmission line L7, is performed. Likewise, two stages of impedance conversion, which includes impedance conversion by the transmission lines L2 and L4 and the impedance conversion by the transmission line L8, is performed. Then, as impedance conversion can be gradually performed in each of the stages, a Doherty amplifier operating in a wider frequency band can be achieved.

INDUSTRIAL APPLICABILITY

The power amplifier according to the above embodiments can be used by various communication systems such as a radio communication system.

REFERENCE SIGNS LIST 1, 1501 CARRIER AMPLIFIER UNIT
2, 1502 PEAK AMPLIFIER UNIT
3, 12, 22 DIVIDING UNIT
4 COMBINING UNIT
11, 21, 1511, 1521 AMPLIFIER
13, 23, 1513 COMBINING AND DIVIDING UNIT
30 COMBINING UNIT
31 HYBRID COUPLER
41 POWER AMPLIFIER
42 TO 45 DIRECTIONAL COUPLER
46 TO 49 TERMINATING RESISTOR
100, 150, 200 POWER AMPLIFIER
101, 151 DOHERTY AMPLIFIER
400 POWER AMPLIFIER
420 CARRIER AMPLIFIER
421 TO 423 PEAK AMPLIFIER
424 TO 426 90° TRANSFORMER
428 OUTPUT LOAD
430 90° TRANSFORMER
432 FOUR-WAY SPLITTER
440 COMBINING UNIT
R1, R2, R3, R30 ABSORBING RESISTOR
Tin INPUT TERMINAL
Tout OUTPUT TERMINAL
L5, L6, L11, L12, L153 TRANSMISSION LINE

What is claimed is:

1. A power amplifier comprising a Doherty amplifier, the Doherty amplifier comprising a carrier amplifier unit and a peak amplifier unit and amplifying an input signal, wherein one of or both the carrier amplifier unit and the peak amplifier unit comprises:
   a plurality of dividing units, signals propagating between first input ports and second output ports and between second input ports and first output ports of the respective plurality of dividing units having phases shifted by 90° from phases of signals propagating between the first input ports and the first output ports and between the second input ports and the second output ports of the respective plurality of dividing units;
   a plurality of amplifiers that receive signals that have been obtained by dividing the input signal, amplify the divided input signals that are in phase, and output the amplified input signals respectively to the first input ports of the plurality of dividing units;
   a combining unit that outputs a combined signal, the combined signal being obtained by combining a signal input to a third input port and a signal input to a fourth input port;
   a first combining and dividing unit that outputs a first combined signal to the third input port of the combining unit, the first combined signal being obtained by combining signals from the first output ports of the respective plurality of dividing units;
   a second combining and dividing unit that outputs a second combined signal to the fourth input port of the combining unit, the second combined signal being obtained by combining signals from the second output ports of the respective plurality of dividing units; and
   a plurality of transmission lines that connect the plurality of amplifiers respectively to the first and second combining and dividing units by the same line length.

2. The power amplifier according to claim 1, wherein the dividing unit is a 3 dB 90° hybrid coupler including two inputs and two outputs.

3. The power amplifier according to claim 1, wherein a resistor is connected between the second input port of the dividing unit and a ground voltage.

4. The power amplifier according to claim 1, wherein the input signal is equally divided, and equally divided input signals are input respectively to the plurality of amplifiers.

5. The power amplifier according to claim 1, wherein
   the first combining and dividing unit divides a first reflected signal from an output of the combining unit and outputs divided first reflected signals respectively to the first output ports of the plurality of dividing units, and
   the second combining and dividing unit divides a second reflected signal from the output of the combining unit and outputs divided second reflected signals respectively to the second output ports of the plurality of dividing units.

6. The power amplifier according to claim 5, wherein in the combining unit, phases of signals propagating between the third input port and a fourth output port and between the fourth input port and a third output port are shifted by 90° from phases of signals propagating between the third input port and the third output port and between the fourth input port and the fourth output port.

7. The power amplifier according to claim 6, wherein the combining unit is a 3 dB 90° hybrid coupler having two inputs and two outputs.

8. The power amplifier according to claim 5, wherein
   the first combining and dividing unit equally divides the first reflected signal and outputs equally divided first reflected signals respectively to the first output ports of the plurality of dividing units, and
   the second combining and dividing unit equally divides the second reflected signal and outputs equally divided second reflected signals respectively to the second output ports of the plurality of dividing units.

9. The power amplifier according to claim 1, wherein the plurality of transmission lines each has a line length of a ¼ waveform of a signal to be transmitted therethrough.

10. The power amplifier according to claim 1, wherein the plurality of the amplifiers have the same gain.

11. The power amplifier according to claim 1, further comprising:
   an impedance converter that is provided between one outputs of the carrier amplifier unit and the peak amplifier unit and an output terminal; and
   a first transmission line that is provided between other outputs of the carrier amplifier unit and the peak amplifier unit and the impedance converter and has a line length of a ¼ wavelength of a signal to be transmitted therethrough, wherein the input signal having a phase shifted by 90° is input to one of the carrier amplifier unit and the peak amplifier unit, an output of which is not connected to the first transmission line.

12. A power amplification method comprising steps of:
inputting an input signal to a Doherty amplifier, the Doherty amplifier comprising a carrier amplifier and a peak amplifier;
in one of or both the carrier amplifier and the peak amplifier,
  dividing the input signal and inputting divided input signals respectively to the plurality of amplifiers;
  combining, by a first combining and dividing unit, signals respectively from first output ports of a plurality of dividing units, and outputting a first combined signal to a third input port of the combining unit from the first combining and dividing unit; and
  combining, by a second combining and dividing unit, signals respectively from second output ports of the plurality of dividing units, and outputting a second combined signal to a fourth input port of the combining unit from the second combining and dividing unit, wherein
  signals are input respectively from the plurality of amplifiers via a plurality of transmission lines having the same line length to the first and second combining and dividing units.

* * * * *